United States Patent [19]

Yamaguchi et al.

[11] Patent Number: 5,444,282
[45] Date of Patent: * Aug. 22, 1995

[54] SEMICONDUCTOR DEVICE AND A METHOD OF MANUFACTURING THEREOF

[75] Inventors: Yasuo Yamaguchi; Natsuo Ajika; Tsuyoshi Yamano, all of Hyogo, Japan

[73] Assignee: Mitsubishi Denki Kabushiki Kaisha, Tokyo, Japan

[*] Notice: The portion of the term of this patent subsequent to Aug. 23, 2011 has been disclaimed.

[21] Appl. No.: 268,877

[22] Filed: Jun. 30, 1994

Related U.S. Application Data

[63] Continuation of Ser. No. 770,041, Oct. 3, 1991, Pat. No. 5,341,028.

[30] Foreign Application Priority Data

Oct. 9, 1990 [JP] Japan ............... 2-271727

[51] Int. Cl.$^6$ ............... H01L 27/01; H01L 29/10; H01L 27/02; H01L 23/48
[52] U.S. Cl. ............... 257/344; 257/351; 257/382; 257/384; 257/900
[58] Field of Search ............... 257/344, 347, 351, 369, 257/382, 383, 384, 900

[56] References Cited

U.S. PATENT DOCUMENTS

| | | | |
|---|---|---|---|
| 4,873,557 | 10/1989 | Kita | 257/900 |
| 5,040,037 | 8/1991 | Yamaguchi et al. | 257/437 |
| 5,341,028 | 8/1994 | Yamaguchi et al. | 257/900 |

FOREIGN PATENT DOCUMENTS

| | | |
|---|---|---|
| 60-186053 | 9/1985 | Japan . |
| 61-137367 | 6/1986 | Japan . |
| 61-270870 | 12/1986 | Japan . |
| 62-032653 | 2/1987 | Japan . |
| 62-143473 | 6/1987 | Japan . |
| 63-012168 | 1/1988 | Japan . |
| 63-084064 | 4/1988 | Japan . |
| 2-181934 | 7/1990 | Japan . |

OTHER PUBLICATIONS

Nishimura et al., "SOI Technology", *Ouyou Butsuri* (Applied Physics), vol. 54, No. 12, (1983) pp. 1274–1283.

*Primary Examiner*—Mark V. Prenty
*Attorney, Agent, or Firm*—Lowe, Price, LeBlanc & Becker

[57] ABSTRACT

A semiconductor device of a field effect transistor having an SOI structure is formed as below. Using a gate electrode 20 as a mask, n type impurities are implanted into an SOI layer of p type to form additional source/-drain regions of intermediate concentration. Then, a relatively thin sidewall spacer is formed at the sidewall of the gate electrode. Using the sidewall spacer as a mask, a titanium silicide layer is formed in self-alignment on the surface of the SOI layer. Next, a relatively thick sidewall spacer is formed. Using this sidewall spacer as a mask, n type impurities are implanted to form a source/drain region of high concentration. According to this manufacturing step, over-etching of the source/drain region are prevented in performing anisotropic etching at the time of sidewall spacer formation.

4 Claims, 12 Drawing Sheets

SEMICONDUCTOR DEVICE AND A METHOD OF MANUFACTURING THEREOF

This application is a continuation of application Ser. No. 07/770,041 filed Oct. 3, 1991, now U.S. Pat. No. 5,341,028.

BACKGROUND OF THE INVENTION

1. Field of the Invention

The present invention relates to semiconductor devices, and more particularly, to a semiconductor device having a relatively thin active region such as a MOS (Metal Oxide Semiconductor) type field effect transistor (referred to as SOI-MOSFET hereinafter) and a method of manufacturing thereof.

2. Description of the Background Art

An SOI-MOSFET to which the present invention is mainly applied will be explained first taking a complementary type MOS (referred to as CMOS hereinafter) as an example of the background technology of the present invention.

A CMOS having low consumption power and superior noise immunity is important in seeking high integration density and high speed operation. A sectional view of a conventional CMOS of not the SOI type but the so-called bulk type is shown in FIG. 1A. Referring to FIG. 1A, a CMOS has an n well region 2 formed in the proximity of the surface of a p type silicon substrate 1. A p channel type MOSFET 4 comprising a polycrystalline silicon gate 4 as the main element is formed on n well region 2. An n channel type MOSFET 6 comprising a polycrystalline silicon gate 5 as the main element is formed at the surface of p type silicon substrate 1 in the region other than n well region 2. A field oxide film 7 insulates and isolates n well region 2 from the other region. When such a bulk type CMOS is reduced in element size, parasitic thyristor is activated by noise from outside so that abnormal current flows from the power supply terminal to the ground terminal to stop the circuit operation (latch up phenomenon). This also induces problems such as soft error by α-particle.

A sectional view of a CMOS having an SOI type structure is schematically shown in FIG. 1B. Referring to FIG. 1B, this SOI type CMOS has semiconductor layers 9 and 10 such as of silicon layers formed island-like by a field insulating film 7 on a silicon substrate 1 with an insulator layer 8 therebetween. Semiconductor layer 9 has an n type channel region and p type source/drain regions of p channel MOSFET 4 formed including polycrystalline silicon gate 3. Semiconductor layer 10 has a p type channel region and n type source/drain regions of n channel MOSFET 6 formed. Such a CMOS of the SOI structure has each element and also the substrate insulation-separated so that there is no current path leading to soft error and latch up. This is advantageous to reduction of element size. It is also advantageous to high speed operation since interconnection capacitance and junction capacitance are reduced by the lower insulating layer (refer to *Ouyou Butsuri* (Applied Physics) Vol. 54, No. 12 (1985) pp. 1274–1283, "SOI Technology").

A structure of a conventional SOI-MOSFET and a method of manufacturing thereof will be explained hereinafter with reference to FIGS. 2, and 3A–3F. Referring to FIG. 2, a conventional SOI-MOSFET has an insulator layer 12 formed on a silicon substrate 11. A relatively thin silicon layer 13 of approximately 300–1500 Å is formed on insulator layer 12. Near the center of silicon layer 13, a channel region 14 having a low p type impurity concentration (for example, $10^{16}$–$10^{17}$/cm$^3$) is formed. An additional source region 15 and an additional drain region 16 having an n type impurity concentration of the middle degree (for example, $10^{18}$/cm$^3$) are formed adjacent to the sides of channel region 14.

Additional source region 15 and additional drain region 16 have a source region 17 and a drain region 18 connected, respectively, each of a high n type impurity concentration (for example $10^{19}$–$10^{20}$/cm$^3$).

A gate electrode 20 is formed above channel region 14 with a dielectric thin film 19 therebetween. A sidewall spacer 21 is formed at the sidewalls of gate electrode 20. Silicon layer 13, gate electrode 20 and sidewall spacer 21 are covered with an interlayer insulating film 22. A contact hole 23 is provided in interlayer insulating film 22. An interconnection layer 24 is connected to gate electrode 20, source region 17 and drain region 18 through each contact hole 23.

When positive voltage is applied to gate electrode 20 in the SOI-MOSFET of the above structure, carriers (electrons) of the n conductivity type are induced towards the upper layer of p type channel region 14, whereby that upper layer is inverted to an n conductivity type identical to the conductivity of source region 17 and drain region 18, or additional source region 15 and additional drain region 16. This allows current to flow between source region 17 and drain region 18. Because the concentration of the n type carriers induced at the upper layer of channel region 14 varies depending on the gate voltage, the current amount flowing across channel region 14 can be controlled by the gate voltage. This explains the operation of a MOSFET.

Additional drain region 16 has the so-called LDD (Lightly-Doped Drain) structure, serving to reduce the electric field in the proximity of the boundary between drain region 18 and gate electrode 20 to suppress generation of electron-hole pairs caused by impact ionization phenomenon. A thin film SOI-MOSFET having a relatively thin silicon layer 13 of, for example, 500–1500 Å thickness, has the following characteristics in comparison with a conventional SOI-MOSFET having a relatively thick silicon layer of approximately 5000 Å. Since channel region 14 where current flows is very thin, the application of a gate voltage causes channel region 14 to become entirely depleted. This allows the depletion layer of channel region 14 to be controlled reliably by gate electrode 20 independent of the effect of the drain voltage. This reduces the effect of electric field from drain region 18 to channel region 14. As a result, the $V_D$–$I_D$ characteristic degradation of FIG. 4A seen in conventional bulk type MOSFETs excluding the SOI type where current increases suddenly by a high drain voltage, i.e. the punch through phenomenon, is suppressed. It will therefore be possible to operate stably a transistor having a short gate length.

A method of manufacturing a conventional SOI-MOSFET having the structure of FIG. 2 will be explained hereinafter with reference to FIGS. 3A–3F. First, oxygen ions are implanted into a silicon substrate 11 at an injection energy of 200 KeV and a dosage of $2 \times 10^{18}$/cm$^3$. Then, the substrate is subjected to heat treatment of approximately 1350° C. An insulating layer 12 is formed in silicon substrate 11 leaving a thin silicon layer 13 on the surface. Next, silicon layer 13 is processed in an island-like manner to form an active region (FIG. 3A). Impurities of p type are injected into silicon layer 13 to form a channel region 14. Next, a dielectric thin film 19 is formed by thermal oxidation of the surface of silicon layer 13. Then, a gate electrode 20 such as of polycrystalline silicon is formed. Ion implantation is carried out using gate electrode 20 as a mask. By implanting phosphorus which is an impurity of n type for example, additional source region 15 and additional drain region 16 are formed (FIG. 3B).

By depositing a CVD insulating film 21a (FIG. 3C) and then carrying out reactive ion etching, a sidewall spacer 21 is formed at the sidewall of gate electrode 20. Some over-etching is necessary in providing sidewall spacer 21. This is to take into consideration unevenness in the thickness of CVD oxide film 21a which is deposited to approximately 3000 Å to leave only sidewall spacer 21 while removing the remainder by etching. This over-etching is responsible for some removal of silicon layer 13 to generate a step as shown in FIG. 3D by arrow A. Specifically, when the application of reactive ion etching to CVD oxide film 21a of, for example, approximately 3000 Å in average is carried out with over-etching of approximately 20% on account of variation in thickness and etching characteristic of CVD oxide film 21a. That is to say, 3000 Å of CVD oxide film 21a is first etched, followed by etching of a time period where 600 Å of CVD oxide film 21a is over-etched. Silicon layer 13 will be over-etched if the thickness of the CVD insulating film deposited thereabove is exactly 3000 Å. A silicon oxide film is generally used for a CVD insulating film, where the selectivity of reactive ion etching to silicon is approximately 5:1. This means that silicon of approximately 120 Å is etched during the time period where over-etching of 600 Å is carried out for a silicon oxide film.

Following the formation of sidewall spacer 21, arsenic ions of $10^{19}$–$10^{20}$/cm$^3$ are injected using sidewall spacer 21 as a mask to form source region 17 and drain region 18 of high concentration, as shown in FIG. 3D. Then, an interlayer insulating film 22 is deposited by CVD, followed by formation of a contact hole 23 in a predetermined position in interlayer insulating layer 22. Some over-etching occurs in forming contact hole 23 to result in a depression indicated by arrow B in FIG. 3E. The formation of an interconnection layer 24 completes the manufacture of a thin film SOI-MOSFET of FIG. 3F.

Because a conventional SOI-MOSFET is manufactured having a structure as described above, over-etching occurs in forming sidewall spacer 21 and contact hole 23, resulting in a silicon layer 13 having a thin portion as shown in arrow A of FIG. 3D and arrow B of FIG. 3E. The resistance of this portion is increased to deteriorate the transistor characteristic. The value of drain current $I_D$ with respect to a predetermined drain voltage $V_D$ is decreased as shown in FIG. 4B. There was also a problem that the transistor does not operate due to the fact that there is some portion where silicon layer 13 is completely removed to cut off source region 17 or drain region 18.

SUMMARY OF THE INVENTION

An object of the present invention is to provide a semiconductor device improved in transistor characteristic by suppressing decrease of film thickness in the semiconductor layer caused by over-etching, and a method of forming thereof.

A semiconductor device according to the present invention includes a semiconductor layer formed on an insulator layer, a channel region of a first conductivity type formed within the semiconductor layer, additional source/drain regions of a second conductivity type formed within the semiconductor layer adjacent to the sides of the channel region, and a gate electrode formed above the channel region with a dielectric thin film therebetween. A first sidewall spacer is formed at the sidewall of the gate electrode. An etching-resistant metal layer is formed on the surface of the semiconductor layer outside the first sidewall spacer. A second sidewall spacer is formed at the outer surface of the first sidewall spacer. Source/drain regions of a second conductivity type having a concentration higher than that of the additional source/drain regions are formed in the semiconductor layer outside the region of the second sidewall spacer adjacent to the additional source/drain regions.

A method of manufacturing a semiconductor device according to the present invention comprises the steps of forming a dielectric thin film on a semiconductor layer formed on an insulating layer, and forming a gate electrode on this dielectric thin film. Using the gate electrode as a mask, impurities of a second conductivity type are implanted into the semiconductor layer to form additional source/drain regions. A first sidewall spacer is formed at the left and right sidewalls of the gate electrode, followed by forming an etching-resistant metal layer in self-alignment at the region where the semiconductor layer is exposed excluding the surface of the first sidewall spacer. After the formation of the metal layer, a second sidewall spacer is formed at the outer surface of the first sidewall spacer. Using this second sidewall spacer as a mask, impurities of a second conductivity type are implanted to form source/drain regions having a concentration higher than that of the additional source/drain regions.

A semiconductor device and a method of manufacturing the same according to the present invention has a double layered structure of a first sidewall spacer formed at the sidewall of a gate electrode and a second sidewall spacer formed at the outer surface thereof. The first sidewall spacer is used as a mask for forming a metal layer on the surface of source/drain regions. The second sidewall spacer is used as a mask in the formation of source/drain regions of high concentration in an LDD structure. This allows the formation of the first sidewall spacer with relatively thin thickness in which the maximum width is approximately 1000 Å. Therefore, over-etching of the source/drain regions is suppressed to a very low degree in anisotropic etching of forming the first sidewall spacer. The formation of an etching-resistant metal layer on the source/drain regions prevents over-etching of the source/drain regions in anisotropic etching in forming the second sidewall spacer.

The foregoing and other objects, features, aspects and advantages of the present invention will become more apparent from the following detailed description of the present invention when taken in conjunction with the accompanying drawings.

BRIEF DESCRIPTION OF THE DRAWING

FIG. 8 is a sectional view of a CMOS having the SOI structure in which the present invention is applied to.

DESCRIPTION OF THE PREFERRED EMBODIMENTS

Figure 5:
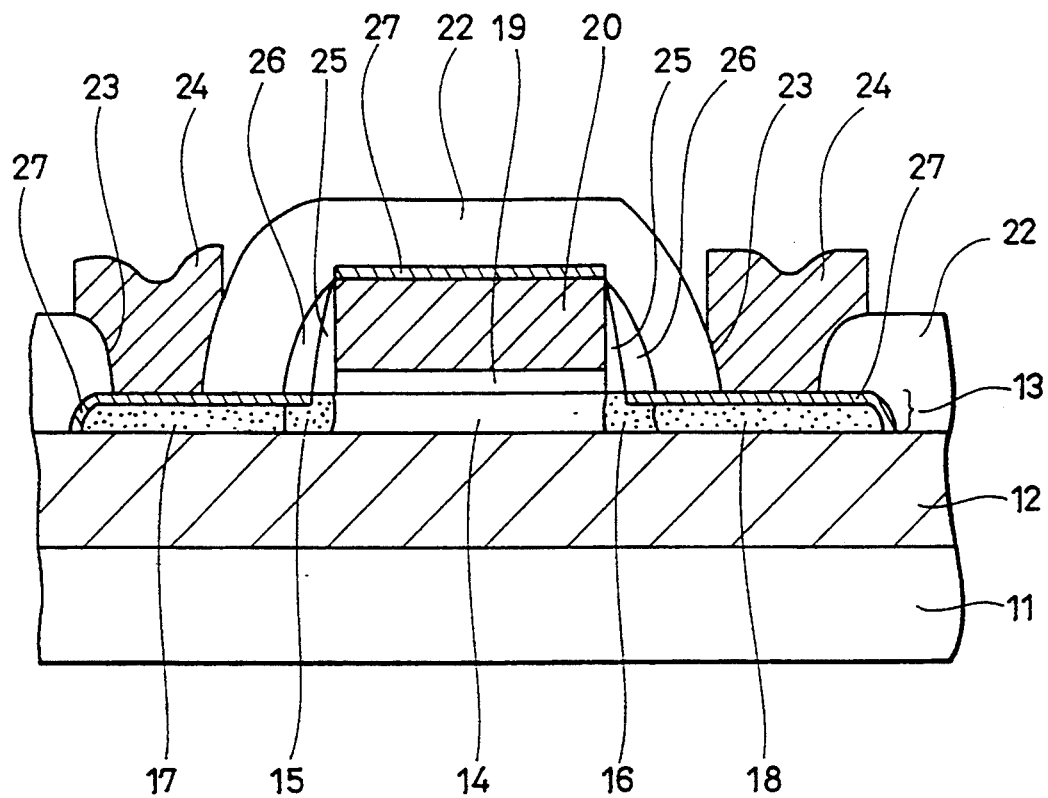
FIG. 5 is a sectional view of a SOI-MOSFET according to an embodiment of the present invention.

An embodiment of the present invention will be explained hereinafter with reference to the drawings. FIG. 5 shows a sectional view of a thin film SOI-MOSFET of the present embodiment. Referring to FIG. 5, this thin film SOI-MOSFET has an insulator layer 12 formed on a silicon substrate 11. A thin silicon layer 13 of approximately 300–1500 Å in thickness is formed as a semiconductor layer on insulator layer 12. Silicon layer 13 has a channel region 14 of low p type impurity concentration (for example $10^{16}$–$10^{17}$/cm³) formed in the proximity of the center thereof. An additional source region 15 and an additional drain region 16 each having a n type impurity concentration of an intermediate level (for example $10^{18}$/cm³) are formed adjacent to the left and right sides of channel region 14. Additional source region 15 and additional drain region 16 have a source region 17 and a drain region 18, respectively, of high n type impurity concentration (for example $10^{19}$–$10^{21}$/cm³) formed adjacent to the sides of channel region 14. A gate electrode 20 is formed above channel region 14 with a dielectric thin film therebetween.

Figure 2:
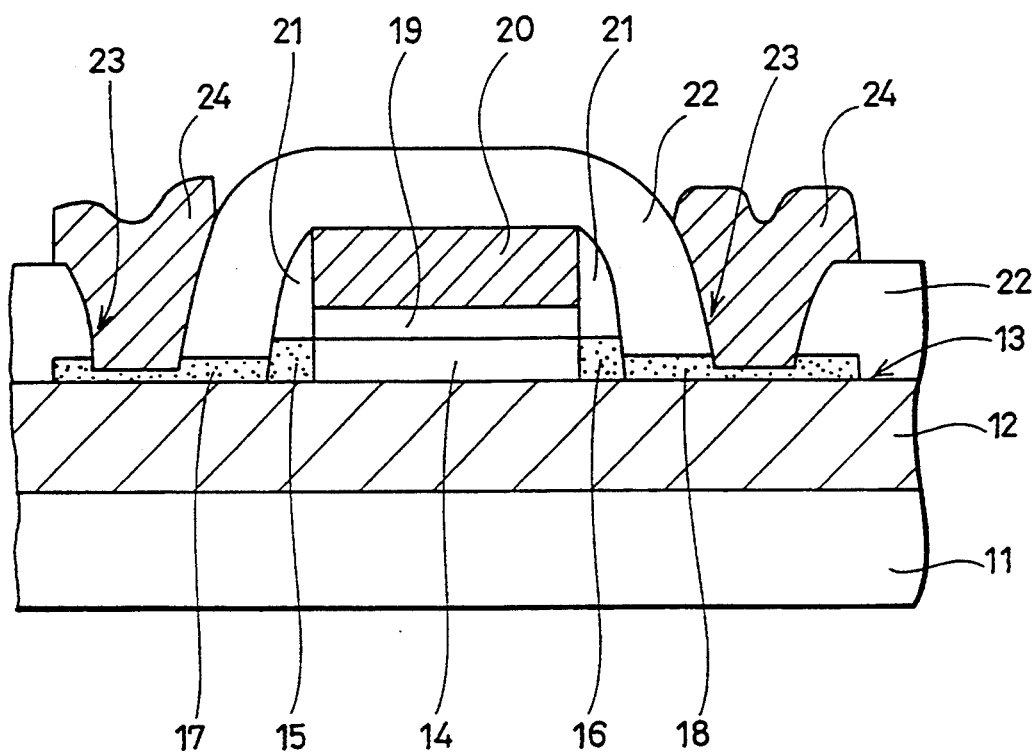
FIG. 2 is a sectional view of a conventional thin SOI-MOSFET.
Figure 3A:
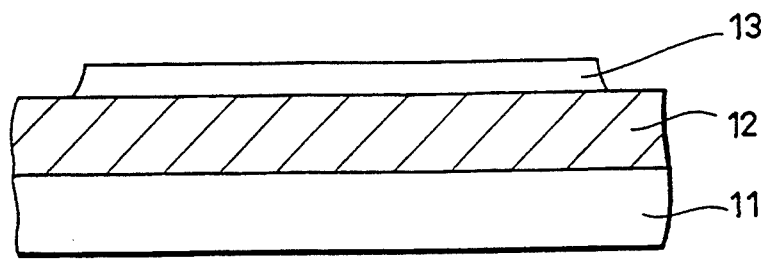
FIGS. 3A–3F are sectional views of a conventional SOI-MOSFET showing the manufacturing steps thereof.
Figure 3B:
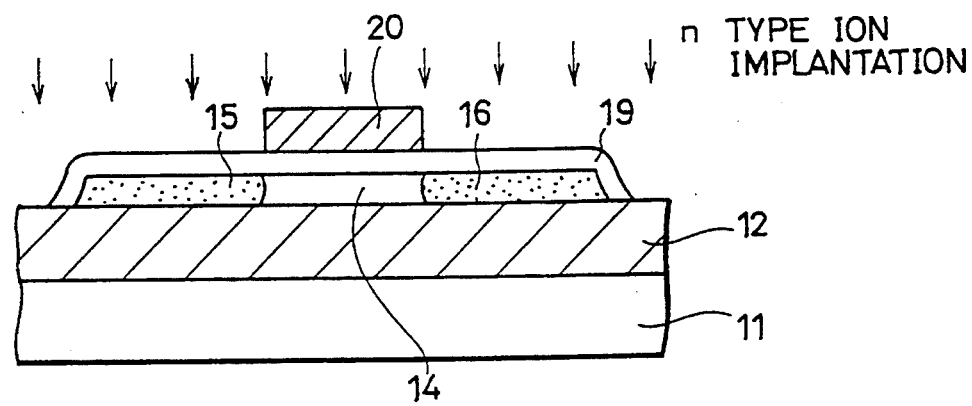
Figure 3C:
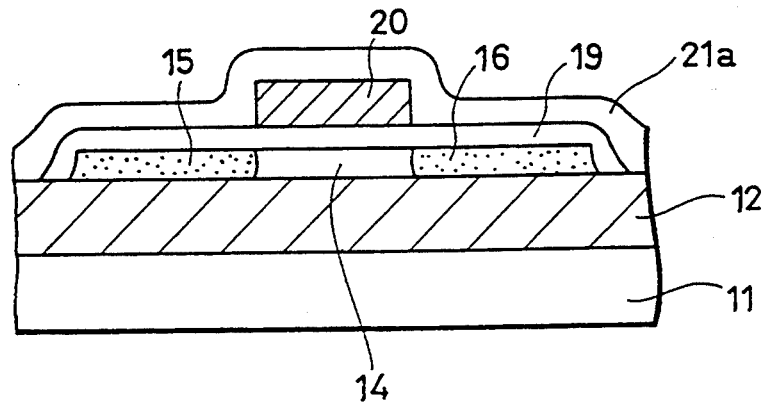
Figure 3D:
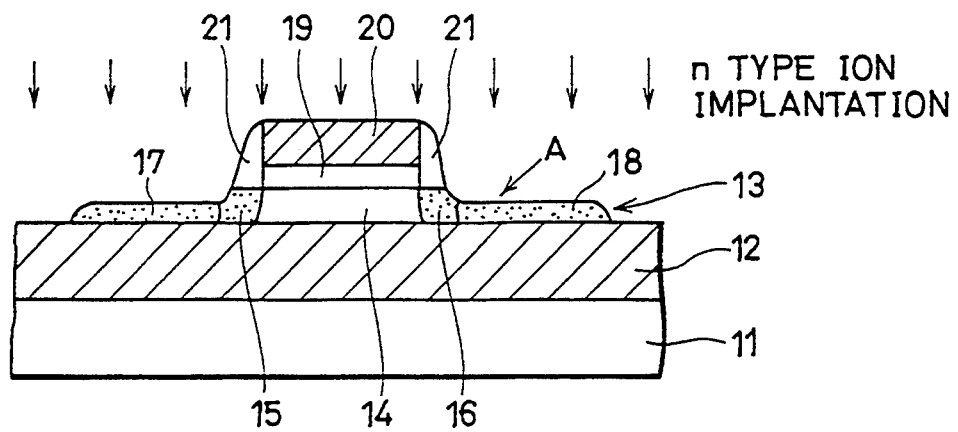
Figure 3E:
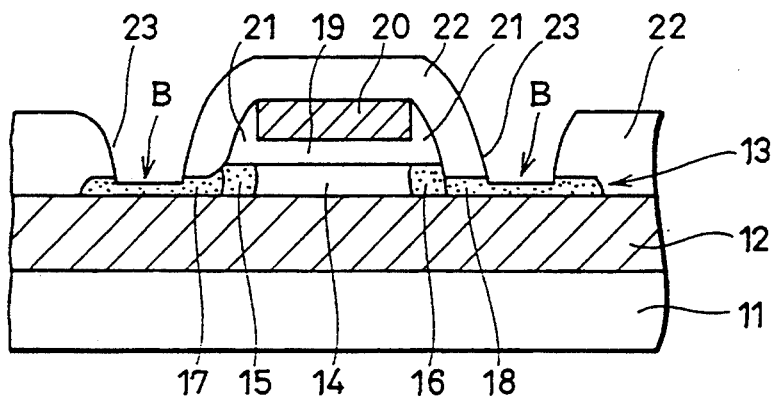
Figure 3F:
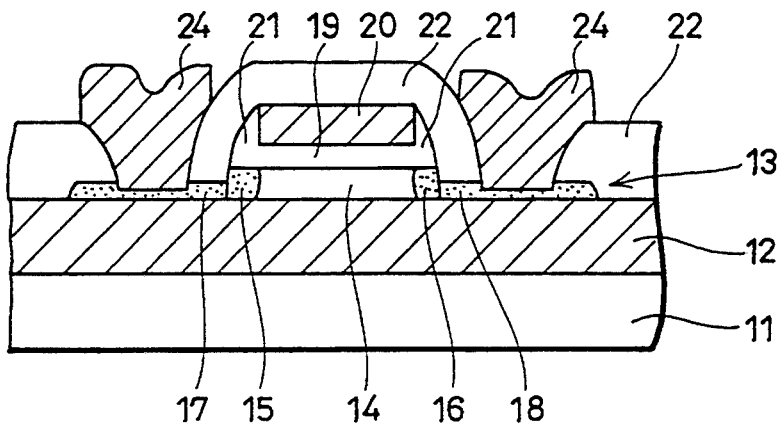
Figure 4A:
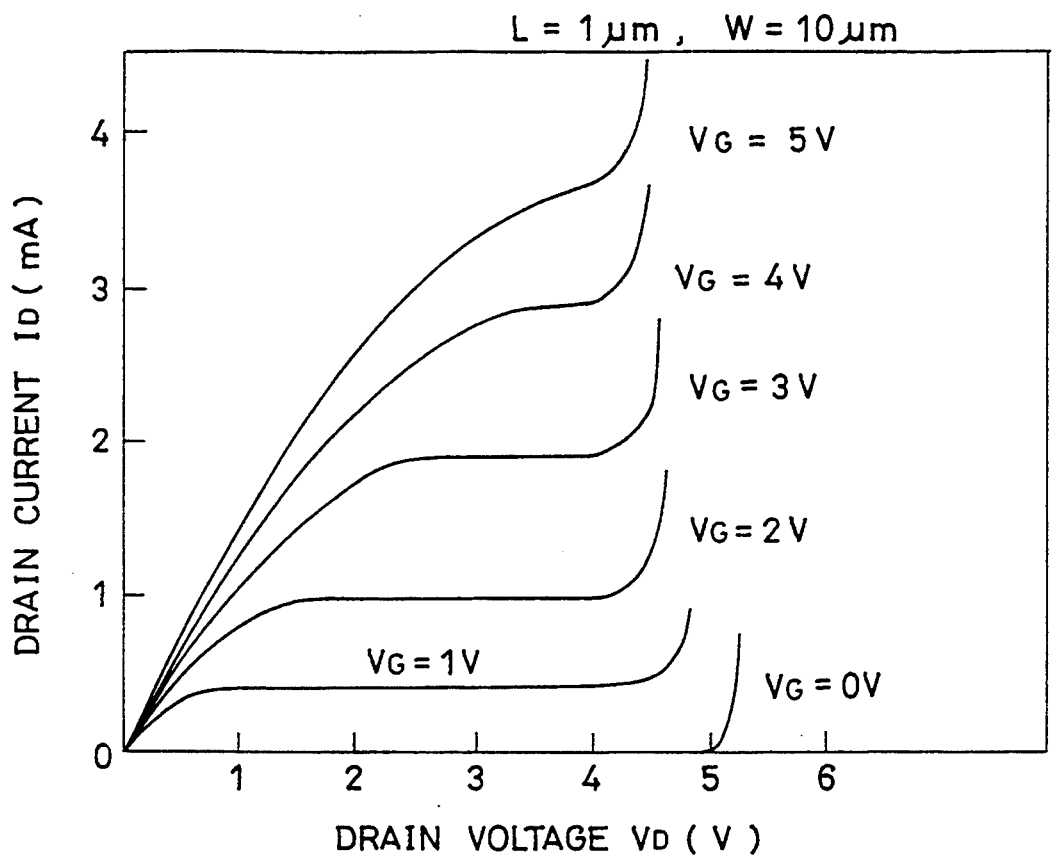
FIG. 4A is a graph showing the $V_D$–$I_D$ characteristic degraded by the so-called punch through phenomenon in a conventional bulk type MOSFET.
Figure 4B:
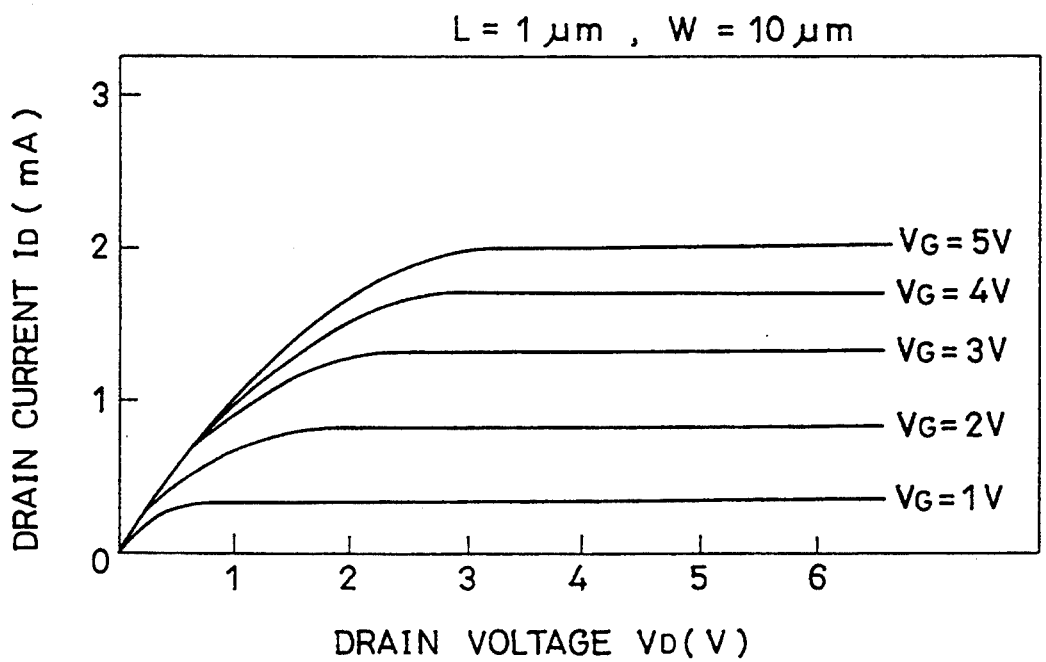
FIG. 4B is a graph of the transistor characteristic where resistance is increased due to a thin silicon layer in source/drain regions in a conventional SOI-MOSFET.

The above structure is similar to the aforementioned conventional embodiment of FIG. 2. The present embodiment shows a first sidewall spacer 25 of relatively thin thickness where the maximum width is approximately 1000 Å at the sidewall of gate electrode 20. A metal layer 27 formed of a thin titanium silicide layer of approximately 500 Å in thickness, for example, is formed on the surface of silicon layer 13 which is not covered with gate electrode 20 or first sidewall spacer 25, and on gate electrode 20. A second sidewall spacer 26 having a maximum thickness of approximately 3000 Å is formed at the outer surface of first sidewall spacer 25. An additional source region 15 or an additional drain region 16 is provided in silicon layer 13 beneath first sidewall spacer 25. A depression or reduction in film thickness due to over-etching is not seen in second sidewall spacer 26 and in silicon layer 13 at the bottom of contact hole 23.

Because metal layer 27 of low resistance is provided on silicon layer 13 in the structure, it is possible to reduce resistance of source region 17 and drain region 18.

Figure 6A:
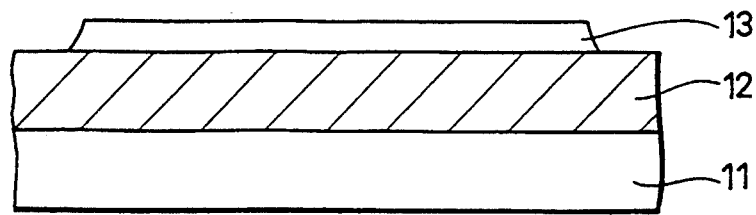
FIGS. 6A–6H are sectional views of the SOI-MOSFET of the embodiment showing the manufacturing steps thereof.
Figure 6B:
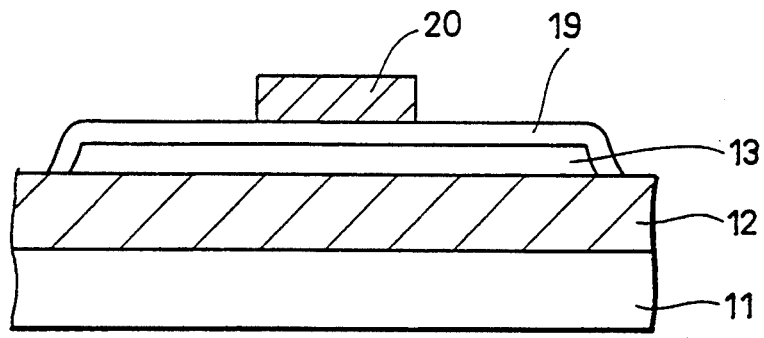
Figure 6C:
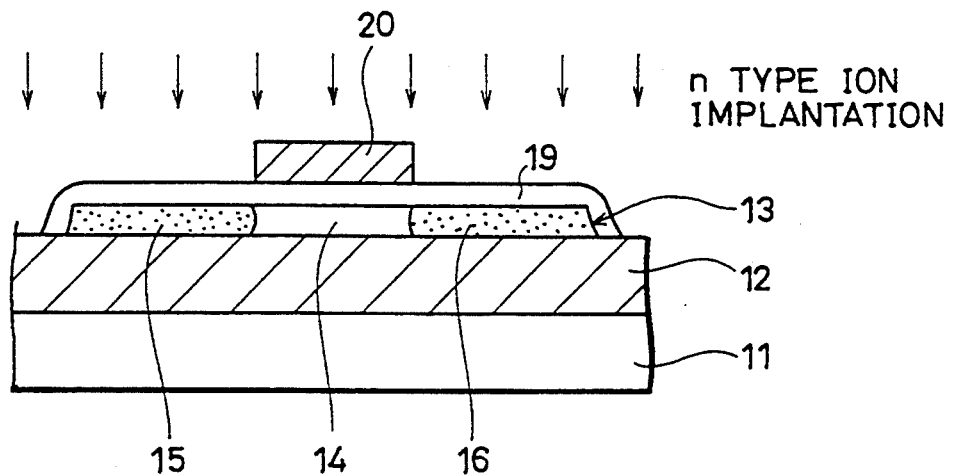
Figure 6D:
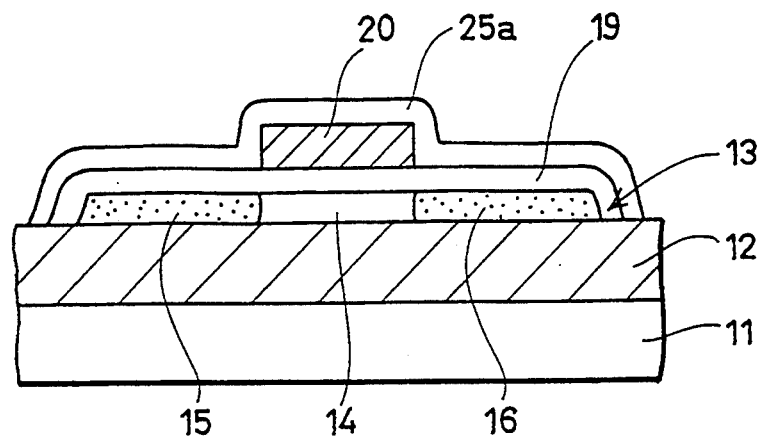

The manufacturing steps of the SOI-MOSFET of the embodiment in FIG. 5 will be explained with reference to FIGS. 6A–6H. According to the method of manufacturing an SOI-MOSFET of the present embodiment, oxygen ions are implanted into silicon substrate 11 at an injection energy of 200 KeV and a dosage of $2 \times 10^{18}$/cm², followed by a heating process of approximately 1350° C. This forms an insulator layer 12 in silicon substrate 11, leaving a thin silicon layer 13 on the surface thereof. Then, silicon layer 13 is processed in an island-like manner to form an active region (FIG. 6A). A channel region 14 is formed introducing impurities of p type into silicon layer 13. The surface of silicon layer 13 is thermal-oxidized to form a dielectric thin film 19. Then, a gate electrode 20 of polycrystalline silicon is formed (FIG. 6B). Using gate electrode 20 as a mask, n type impurities such as phosphorus ions are implanted at an injection energy of 80 KeV and a dosage of $1 \times 10^{13}$/cm² to form an additional source region 15 and an additional drain region 16 of a concentration of approximately $10^{18}$/cm³ (FIG. 6C).

Figure 6E:
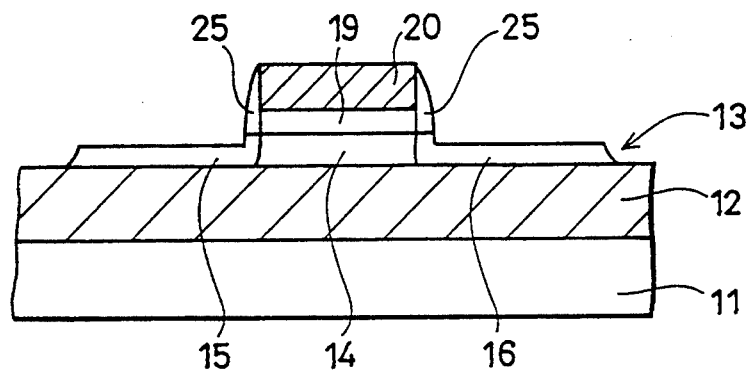

The above described manufacturing steps are similar to those of the aforementioned conventional embodiment. In the present embodiment, a CVD oxide film 25a is formed (FIG. 6D), followed by formation of a first sidewall spacer 25 by reactive ion etching (FIG. 6E). If the film thickness of CVD oxide film 25a is approximately set to 1000 Å for example, reduction in thickness of silicon layer 13 due to over-etching is very low. This is because the over-etching amount of CVD oxide film 25a is set to be approximately 200 Å which is 20% of 1000 Å and the etching selectivity of silicon is approximately 1/5 of CVD oxide film 25a, so that the over-etching amount of silicon layer 13 is approximately 40 Å.

Figure 6F:
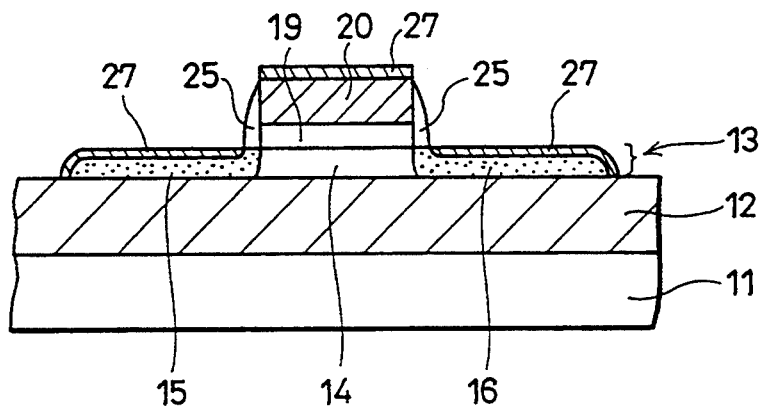
Figure 6G:
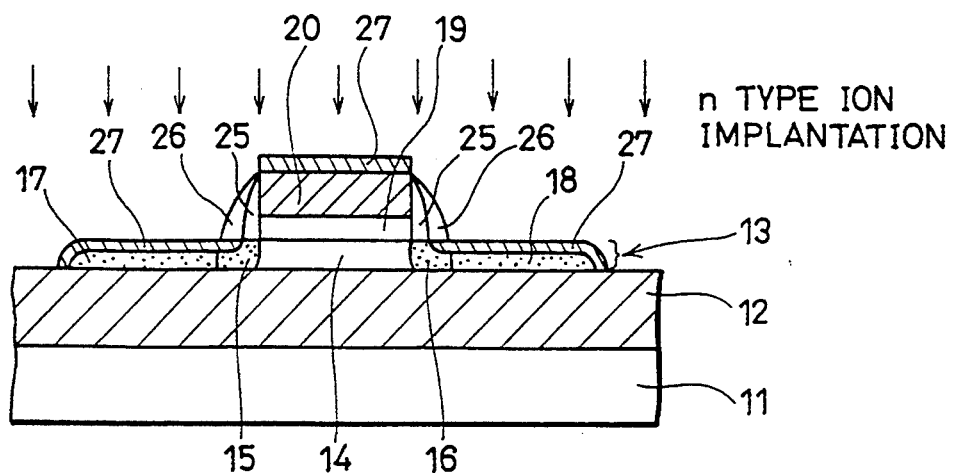

A metal layer 27 of titanium silicide, for example, is formed on silicon layer 13 or on gate electrode 20 by a self-aligning method described hereinafter (FIG. 6F). In forming a titanium silicide layer for metal layer 27, titanium is deposited all over the surface to a thickness in a range from several hundreds to a thousand Å (several 100 sÅ–1000 Å), followed by heat process to silicide the exposing portion of silicon or polycrystalline silicon, resulting in formation of a titanium silicide layer. Titanium on insulator layer 12 or on the surface of sidewall spacer 25 is left unreacted, or is nitrided to be changed to titanium nitride. By removing the unreacted titanium or titanium nitride with sulfuric acid, metal layer 27 of titanium silicide layer is selectively formed on silicon layer 13 or gate electrode 20. Next, a CVD oxide film of approximately 3000 Å thickness is deposited all over the surface to be subjected to anisotropic etching for forming a second sidewall spacer 26. Using sidewall spacer 26 as a mask, n type impurities such as phosphorus ions and arsenic ions are doped to form a source region 17 and a drain region 18 (FIG. 6G). In forming second sidewall spacer 26, over-etching of silicon layer 13 is prevented since metal layer 27 covers silicon layer 13. This is because the etching selectivity of metal layer 27 with respect to the CVD insulating film forming sidewall spacer 26 is decreased to approximately 1/20.

Figure 6H:
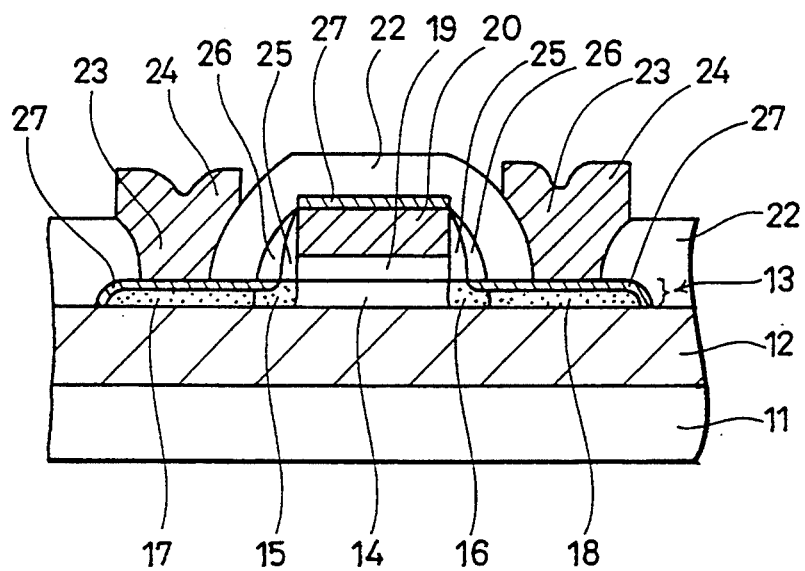

The formation of interconnection layer 24 results in the sectional view, of FIG. 6H. Interconnection layer 24 is electrically connected to source region 17 and drain region 18 via metal layer 27 in contact hole 23.

Although titanium silicide is described as the material of metal layer 27 in the present embodiment, similar effects can be obtained using other materials such as cobalt silicide or selective tungsten layer as long as the metal layer has conductivity and etching resistance, and is capable of being formed in self-alignment. Selective tungsten layer takes advantage of the fact that the core of tungsten is easily generated on silicon by the following reaction equation.

$$WF_6 + Si \rightarrow W + SiF_6 \uparrow$$

Although a monocrystalline silicon layer is used as the semiconductor layer in the present embodiment, similar effects can be obtained using a semiconductor layer of polycrystalline silicon or gallium arsenic.

Although the present embodiment is described in which an n channel MOSFET is employed, a p channel MOSFET may be used. Identical effects can be obtained with only the conductivity type reversed.

Although the present invention is applied to a thin film SOI-MOSFET in the present embodiment, the prevention of over-etching which is the object of the present invention is also effectively applicable to the so-called bulk MOSFET provided on a semiconductor substrate. The present invention has particular effect in a semiconductor device having a relatively shallow source/drain junction.

Figure 7:
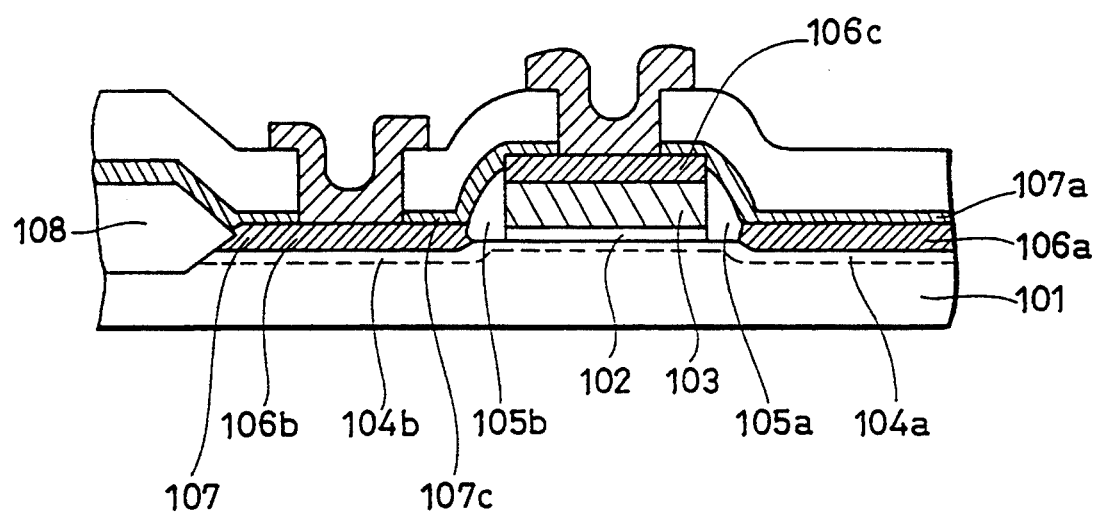
FIG. 7 is a sectional view of a structure where a titanium silicide layer is formed on the surface of the source/drain regions of a bulk type MOSFET according to conventional technology associated with the present invention.

As a conventional technology associated with the above described embodiment, a structure where a titanium silicide film is foiled on the surface of the source/drain regions of a bulk type MOSFET of FIG. 7 is disclosed in Japanese Patent Laying-Open No. 61-270870. Referring to FIG. 7, the structure disclosed in the aforementioned publication has a gate electrode 103 formed above silicon substrate 101 with an insulating film 102 therebetween. At the left and right sides of gate electrode 103, sidewall spacers 105a and 105b of an insulating film are formed which insulates gate electrode 103 from impurity diffusion layers 104a and 104b which become the source/drain regions. A titanium silicide film 106a is formed on impurity diffusion layer 104a. A titanium silicide film 106c is formed on gate electrode 103. A titanium silicide film 106b is formed on impurity diffusion layer 104b. An oxide titanium film 107a is formed on titanium silicide film 106a, sidewall spacer 105a, and titanium silicide film 106c. An oxide titanium film 107c is formed on titanium silicide film 106b, sidewall spacer 105b, and titanium silicide film 106c. An oxide titanium film 107b is formed on titanium silicide film 106b and on a relatively thick insulating film 108. According to this structure, titanium silicide layers 106a and 106b contribute to reduction in sheet resistance of impurity diffusion layers 104a and 104b.

However, impurity diffusion layers 104a and 104b will be over-etched by the anisotropic etching step in forming sidewall spacers 105a and 105b because sidewall spacers 105a and 105b of FIG. 7 are of a single layer structure relatively great in thickness. The application of such a structure in a semiconductor device having an active region of a thin semiconductor layer, such as a thin type SOI-MOSFET, cannot have the problem solved of increase in resistance of the source/drain regions due to over-etching.

Figure 1A:
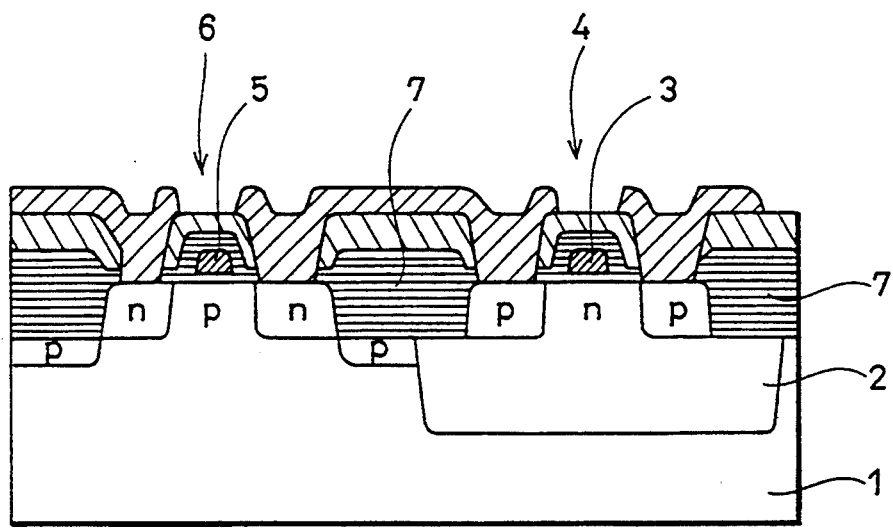
FIG. 1A is a sectional view of a conventional bulk type CMOS.
Figure 1B:
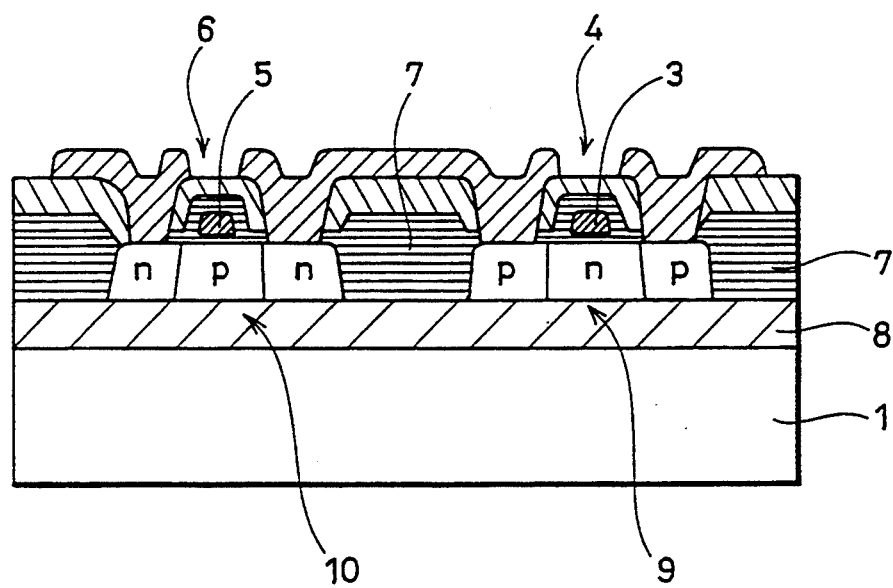
FIG. 1B is a sectional view of a conventional SOI-CMOS.
Figure 8:
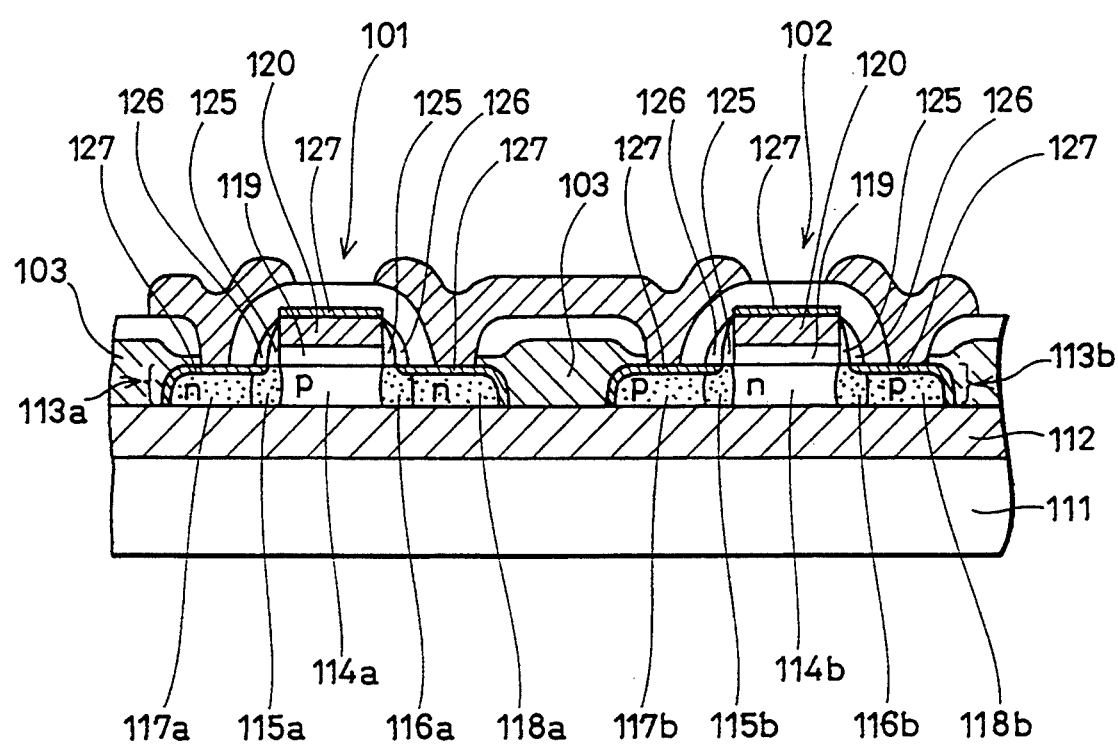

An embodiment where the present invention is applied to a CMOS having an SOI structure will be explained hereinafter. FIG. 8 shows a sectional view of an SOI type CMOS where the present invention is applied to the conventional structure of FIG. 1A. Referring to FIG. 8, silicon layers 113a and 113b as the semiconductor layer are formed in an island-like manner on a silicon substrate 111 with an insulator layer 112 therebetween. An n channel MOS 101 is formed at silicon layer 113a. A p channel MOS 102 is formed at silicon layer 113b. Specifically, a p channel region 114a is formed in the middle of silicon layer 113a. An n type additional source region 115a and an additional drain region 116a are formed adjacent to the left and right sides of channel region 114a. A source region 117a and a drain region 118a are formed adjacent to additional source region 115a and additional drain region 116a, respectively. A gate electrode 120 is formed above channel region 114a with a dielectric thin film 119 therebetween. A first sidewall spacer 125 and a second sidewall spacer 126 forming a double layered structure are formed at the left and right sides of gate electrode 120. A metal layer 127 such as of titanium silicide layer is formed on the surface of silicon layer 113a at the region outside first sidewall spacer 125 and on the surface of gate electrode 120. Silicon layer 113b isolated from silicon layer 113a by a field insulating film 103 has a channel region 114b of the n type formed in the middle thereof. An additional source region 115b and an additional drain region 116b of the p type are formed adjacent to the left and right sides of channel region 114b. A high concentration p type source region 117b and a drain region 118b are formed on the further outer left and right sides of additional source and drain regions of 115b and 116b, respectively. The structures of gate electrode 120 and first sidewall spacer 125, and second sidewall spacer 126 and metal layer 127 are similar to those of the above described n channel MOS 101.

According to an SOI type CMOS having the above described structure is free of soft error and latch up phenomenon. Also, resistance of the source/drain regions are held low to improve the current characteristic of the transistor.

Figure 9:
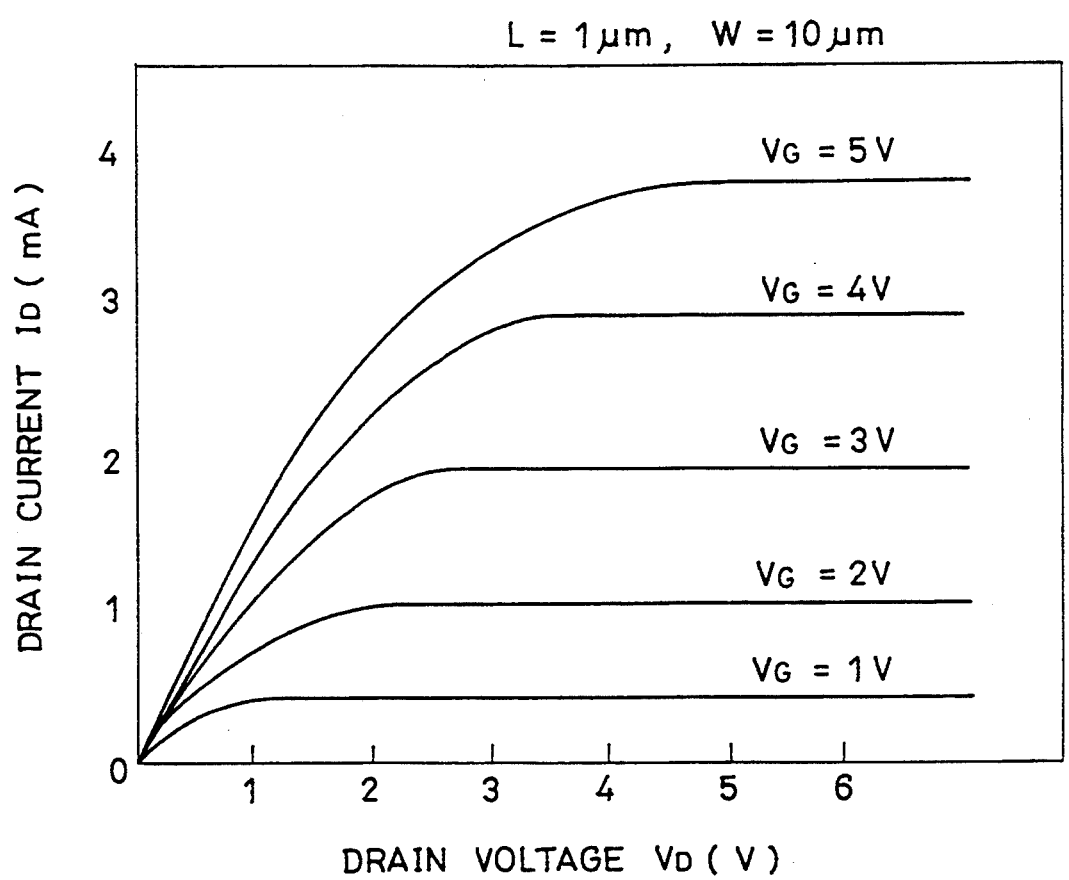
FIG. 9 is a graph of the $V_D$–$I_D$ characteristic of a thin SOI-MOSFET according to the embodiments of the present invention.

The $V_D-I_D$ characteristic of the SOI-MOSFET obtained by the above described embodiment is superior as shown in the graph of FIG. 9.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor layer formed on an insulator layer,
   a channel region of a first conductivity type formed in said semiconductor layer,
   first source/drain regions of a second conductivity type formed in said semiconductor layer adjacent to the left and right sides of said channel region,
   a gate electrode formed above said channel region with a dielectric thin film therebetween,
   first sidewall spacers provided on the left and right sidewalls of said gate electrode,
   a metal layer having etching-resistance formed at the surface of said semiconductor layer in a region outside the region where said first sidewall spacers are formed and adjacent to said first sidewall spacers, second sidewall spacers provided to cover the outer surface of said first sidewall spacers, second source/drain regions having a concentration higher than that of said first source/drain regions, and formed in said semiconductor layer in a region outside the region where said second sidewall spacers are formed, and an interconnection layer connected to a surface of said metal layer, wherein said metal layer comprises cobalt silicide.

2. A semiconductor device comprising:

two semiconductor layers formed on a same insulator layer insulation-isolated from each other;

a gate electrode formed above each of said semiconductor layers with a gate dielectric thin film therebetween;

first sidewall spacers provided at the left and right sidewalls of each said gate electrode;

a metal layer having etching-resistance, and formed in a region outside the region where said first sidewall spacers are formed at the surface of each said semiconductor layer and adjacent to said first sidewall spacers;

second sidewall spacers formed to cover the outer surface of each of said first sidewall spacers; and an interconnection layer connected to a surface of said metal layer; wherein one of said two semiconductor layers comprises
 a channel region of p type right beneath said gate electrode;
 first source/drain regions of n type formed adjacent to the left and right sides of said channel region; and
 second source/drain regions of n type having a concentration higher than that of said first source/drain regions of n type, and formed adjacent to said first source/drain regions of n type at a region outside the region where said second sidewall spacers are formed, and the other semiconductor layer comprises
 a channel region of n type right beneath said gate electrode;
 first source/drain regions of p type formed adjacent to the left and right sides of said channel region; and
 second source/drain regions of p type having a concentration higher than that of said first source/drain regions of p type, and formed adjacent to said first source/drain regions of p type in a region outside the region where said second sidewall spacers are formed, wherein said metal layer comprises cobalt silicide.

3. A semiconductor device comprising:

a semiconductor layer formed on an insulator layer, a channel region of a first conductivity type formed in said semiconductor layer, first source/drain regions of a second conductivity type formed in said semiconductor layer adjacent to the left and right sides of said channel region, a gate electrode formed above said channel region with a dielectric thin film therebetween, first sidewall spacers provided on the left and right sidewalls of said gate electrode, a metal layer having etching-resistance formed at the surface of said semiconductor layer in a region outside the region where said first sidewall spacers are formed and adjacent to said first sidewall spacers, second sidewall spacers provided to cover the outer surface of said first sidewall spacers, second source/drain regions having a concentration higher than that of said first source/drain regions, and formed in said semiconductor layer in a region outside the region where said second sidewall spacers are formed, and an interconnection layer connected to a surface of said metal layer, wherein said metal layer comprises selective tungsten.

4. A semiconductor device comprising:

two semiconductor layers formed on a same insulator layer insulation-isolated from each other;

a gate electrode formed above each of said semiconductor layers with a gate dielectric thin film therebetween;

first sidewall spacers provided at the left and right sidewalls of each said gate electrode;

a metal layer having etching-resistance, and formed in a region outside the region where said first sidewall spacers are formed at the surface of each said semiconductor layer and adjacent to said first sidewall spacers;

second sidewall spacers formed to cover the outer surface of each of said first sidewall spacers; and an interconnection layer connected to a surface of said metal layer; wherein one of said two semiconductor layers comprises
 a channel region of p type right beneath said gate electrode;
 first source/drain regions of n type formed adjacent to the left and right sides of said channel region; and
 second source/drain regions of n type having a concentration higher than that of said first source/drain regions of n type, and formed adjacent to said first source/drain regions of n type at a region outside the region where said second sidewall spacers are formed, and the other semiconductor layer comprises
 a channel region of n type right beneath said gate electrode;
 first source/drain regions of p type formed adjacent to the left and right sides of said channel region; and
 second source/drain regions of p type having a concentration higher than that of said first source/drain regions of p type, and formed adjacent to said first source/drain regions of p type in a region outside the region where said second sidewall spacers are formed, wherein said metal layer comprises selective tungsten.

* * * * *

UNITED STATES PATENT AND TRADEMARK OFFICE
CERTIFICATE OF CORRECTION

PATENT NO. : 5,444,282

DATED : August 22, 1995

INVENTOR(S) : Yasuo YAMAGUCHI et al.

It is certified that error appears in the above-indentified patent and that said Letters Patent is hereby corrected as shown below:

On the title page, Item [*] should read as follows:

--[*] Notice: The portion of the term of this patent subsequent to October 3, 2011 has been disclaimed.--

Signed and Sealed this

Thirtieth Day of July, 1996

Attest:

BRUCE LEHMAN

*Attesting Officer*  *Commissioner of Patents and Trademarks*